United States Patent
Ramakrishnan et al.

[11] Patent Number: 5,574,857
[45] Date of Patent: Nov. 12, 1996

[54] ERROR DETECTION CIRCUIT FOR POWER UP INITIALIZATION OF A MEMORY ARRAY

[75] Inventors: K. K. Ramakrishnan, Rancho Cordova; Randy Steele, Folsom; Joseph H. Salmon, Placerville, all of Calif.

[73] Assignee: Intel Corporation, Santa Clara, Calif.

[21] Appl. No.: 189,188

[22] Filed: Jan. 31, 1994

[51] Int. Cl.$^6$ .................................................. G06F 11/34
[52] U.S. Cl. .......................... 395/185.07; 395/183.18; 371/21.2
[58] Field of Search ................... 371/21.1, 21.2, 371/21.3, 51.1, 66, 40.1; 395/575, 183.18, 185.01, 185.06, 185.07; 365/189.04, 189.05, 189.07, 201

[56] References Cited

U.S. PATENT DOCUMENTS

| | | | |
|---|---|---|---|
| 4,554,664 | 11/1985 | Schutz | 371/25 |
| 5,075,892 | 12/1991 | Choy | 371/68.1 |
| 5,166,936 | 11/1992 | Ewert et al. | 371/21.2 |
| 5,179,536 | 1/1993 | Kasa et al. | 365/200 |
| 5,185,748 | 2/1993 | Fujimura | 395/185.07 |
| 5,210,865 | 5/1993 | Davis et al. | 364/200 |
| 5,343,436 | 8/1994 | Suzuki | 365/228 |
| 5,359,569 | 10/1994 | Fujita et al. | 365/229 |
| 5,381,418 | 1/1995 | Montoye | 371/21.2 |
| 5,396,619 | 3/1995 | Walton | 395/575 |
| 5,430,687 | 7/1995 | Hung et al. | 365/230.08 |

Primary Examiner—Robert W. Beausoliel, Jr.
Assistant Examiner—Albert Décady
Attorney, Agent, or Firm—Blakely, Sokoloff, Taylor & Zafman

[57] ABSTRACT

A circuit for testing the accuracy with which data is written from a first memory cell to a second memory cell including a shift register including master and slave portions, apparatus for placing data from the first memory cell into the master portion of the shift register and shifting the data into the slave portion of the shift register, apparatus for placing the data from the first memory cell into the second memory cell, apparatus for placing the data in the second memory cell back into the master portion of the shift register, and logic circuitry for testing the condition of the data in the master portion of the shift register against the condition of the data in the slave portion of the shift register to determine if the data has been correctly written into the second memory cell.

18 Claims, 3 Drawing Sheets

ERROR DETECTION CIRCUIT FOR POWER UP INITIALIZATION OF A MEMORY ARRAY

BACKGROUND OF THE INVENTION

1. Field of the Invention

This invention relates to computer systems, and more particularly, to an apparatus and a method for testing to determine that data stored in non-volatile memory has been correctly written to volatile memory such as static random access memory (SRAM) when power is applied to a computer system.

2. History of the Prior Art

There are situations in which it is desirable to transfer data stored in a non-volatile memory such as an electrically-programmable read only memory (EPROM) to volatile memory. For example, when power is initially applied to a computer system, the basic input/output startup (BIOS) program of Intel based computers typically stored in non-volatile memory may be transferred to main memory so that its operations become available more rapidly to the central processing unit. In another case, a programmable logic circuit may be used to control the association of various peripheral devices with the system bus of a computer system. Such a programmable logic circuit may include an array of volatile memory cells which are written to provide the various logic functions desired to be performed. Volatile memory cells may be initialized with data stored in non-volatile memory when power is first applied to a computer system.

In some arrangements in which data stored in a non-volatile memory is transferred to volatile memory, the volatile memory is a static random access memory (SRAM) array. It is often necessary with a SRAM array to make sure that the data intended to be loaded in the SRAM array has actually been loaded to the array so that that data may be used with assurance. The problem is especially acute because SRAM arrays are often loaded during the period in which a computer is first being turned on. At this time, the chance for error in loading is much greater because the operating conditions have often not yet stabilized and great demands are being placed on its power supply.

It is therefore desirable to provide circuitry for accurately testing the data values which have been written to a SRAM array from a non-volatile memory array in order to assure that the data has been written accurately.

SUMMARY OF THE INVENTION

It is, therefore, an object of the present invention to provide circuitry for testing the data written to the memory cells of a volatile memory array from non-volatile storage in order to assure that the data has been written accurately.

It is another, more specific, object of the present invention to provide circuitry which may be inexpensively implemented for testing the data written to the memory cells of a volatile memory array from non-volatile storage in order to assure that the data has been written accurately.

These and other objects of the present invention are realized in a circuit for testing the accuracy with which data is written from a first memory cell to a second memory cell comprising a shift register including master and slave portions, apparatus for placing data from the first memory cell into the master portion of the shift register and shifting the data into the slave portion of the shift register, apparatus for placing the data from the first memory cell into the second memory cell, apparatus for placing the data in the second memory cell back into the master portion of the shift register, and apparatus for testing the condition of the data in the master portion of the shift register against the condition of the data in the slave portion of the shift register to determine if the data has been correctly written into the second memory cell.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
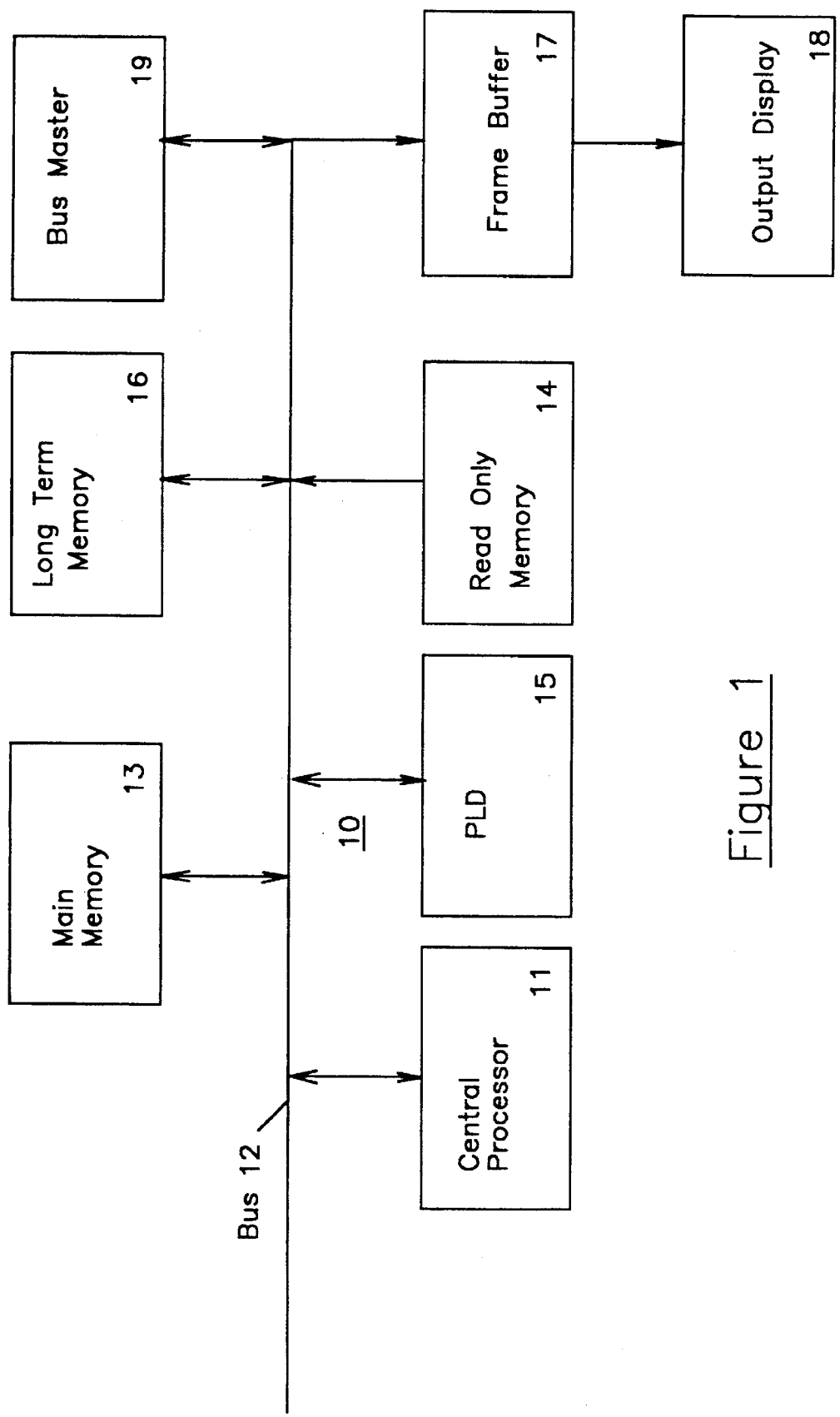
FIG. 1 is a block diagram of a computer system utilizing the present invention.

Referring now to FIG. 1, there is illustrated a computer system 10. The system 10 includes a central processing unit 11 which carries out the various instructions provided to the computer system 10 for its operations. The central processing unit 11 is joined to a bus 12 adapted to carry information to various components of the system 10. Joined to the bus 12 is main memory 13 which is typically constructed of dynamic random access memory arranged in a manner well known to those skilled in the prior art to store information during the period in which power is provided to the system 10. Also joined to the bus 12 is read only memory 14 which may include various memory devices (such as electrically programmable read only memory devices (EPROM devices)) well known to those skilled in the art which are adapted to retain a memory condition in the absence of power to the system 10. The read only memory 14 typically stores various basic functions used by the central processing unit 11 such as basic input output processes and startup processes.

Also connected to the bus 12 are various peripheral components such as long term memory 16. The construction and operation of long term memory 16 (typically electro-mechanical hard disk drives) is well known to those skilled in the art. Also joined to the bus 12 is circuitry such as a frame buffer 17 to which data may be written which is to be transferred to an output device such as a monitor 18 for display. A bus master 19 is shown joined to the bus 12. A bus master typically includes its own local processor and is able to control operations on a bus. A circuit 15 may also be joined to the bus 12. The circuit 15 may be a programmable logic circuit (such as a programmable logic array, a programmable array logic circuit, or a programmable logic device) constructed in a manner well known to those skilled in the art which is used to provide the logic circuitry by which various ones of the component circuits may be associated through the bus 12 with the system.

A memory array which is initialized from data stored in non-volatile memory such as the read only memory 14 whenever power is provided may be utilized in such a system 10 as that shown in FIG. 1 in accordance with the teachings of the present invention. Such circuitry may be used, for example, to provide storage capabilities in any of a number of components used in the system of FIG. 1. For example, any bus master component which itself includes a processor or controller may have associated therewith SRAM memory which may be utilized to furnish instructions for its local processor. Such a memory array is utilized, for example, with certain flash EEPROM memory arrays. A SRAM memory might also be associated with a central processing unit 11 or some other component of the system to provide particular instructions for use by a processor used for specialized purposes.

The programmable logic circuit 15 may be designed to utilize a preferred embodiment of the present invention. For example, the logic functions of the programmable logic circuit may be programmed by writing the states of various volatile memory cells such as SRAM cells. The states to which the volatile cells are written each time the computer system is turned on may be stored in a non-volatile memory which is a part of the same integrated circuit as the volatile memory cells and the other elements of the programmable logic circuit.

Figure 2:
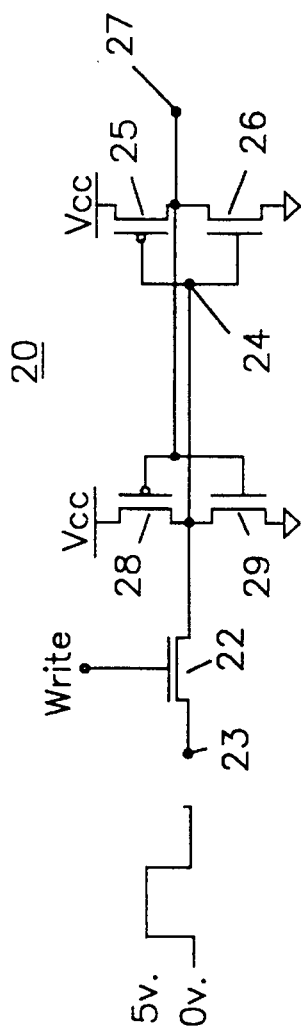
FIG. 2 is a circuit diagram of a SRAM memory cells which may be used in a memory array to store a condition held in non-volatile memory cells during an off condition of a system utilizing the memory array.

Referring now to FIG. 2, there is illustrated a SRAM memory cell 20 designed to store one of two binary conditions which will be referred to herein as high (one) or low (zero). The cell 20 may be used in accordance with the present invention to store a binary condition which is typically retained in some form of non-volatile memory during a period in which a computer system or some similar electronic system using the cell 20 is in the off condition. For example, it is typical for data to be stored in an EPROM memory array while a computer is off, then to be read from that array to faster SRAM memory once the computer is started.

The cell 20 includes an N type field effect transistor (FET) device 22 through which an input signal level is applied for writing to the cell 20. Typically, a write control signal is applied to the gate of the device 22 so that the voltage at a terminal 23 is applied to the cell 20. Depending on the particular condition to be stored in the cell 20, the input voltage level furnished at the terminal 23 from the non-volatile cell will be either high (e.g., 5 v.) or low (ground). The voltage furnished to the cell 20 (less the switching voltage Vt of the device 22) is applied at a node 24. The node 24 joins to the gate terminals of a pair of FET devices 25 and 26. The device 25 is a P type device and has its source terminal joined to a power supply voltage Vcc which may be five volts. The drain terminal of the device 25 is connected to the drain terminal of the N type FET 26 which has its source terminal joined to ground. A high voltage level furnished by the device 22 turns on the device 26 and applies ground to an output terminal 27. A low voltage furnished by the device 22 turns on the device 25 and applies Vcc to the output terminal 27. The value at the output terminal 27 is fed back to the gate terminals of a second pair of FET devices 28 and 29. The device 28 is a P type device and has its source terminal joined to the power supply voltage Vcc. The drain terminal of the device 28 is connected to the drain terminal of the N type FET 29 which has its source terminal joined to ground.

The output voltage at the terminal 27, if low, turns on the device 28 and applies Vcc to the node 24. The output voltage at the terminal 27, if high, turns on the device 29 and applies ground to the node 24. The value provided by the device 28 or 29 to the node 24 remains when the device 22 is disabled so that the cell 20 stays in the condition to which it has been switched by the input signal furnished through the device 22.

However, for many reasons the value actually written to a cell 20 may not be the desired value. For example, if the level of the source voltage Vcc is low or if some other unexpected condition occurs, then the value fed back to operate the devices 28 and 29 may be insufficient to switch the correct one of the devices 28 and 29 to the correct operating state.

This is particularly true when switching to the one state. Then, when the device 22 is disabled, the voltage at the gates of the devices 25 and 26 will not hold the cell 20 in the correct state. This causes a storage failure. There are many other reasons for storage failures.

Many systems cannot tolerate such write failures, especially where the values stored are used to control the operation of the system. Consequently, it is desirable to provide circuitry for assuring that the memory cells of a volatile memory array have, in fact, been written with the data stored in the non-volatile memory array from which the data is loaded.

Figure 3:
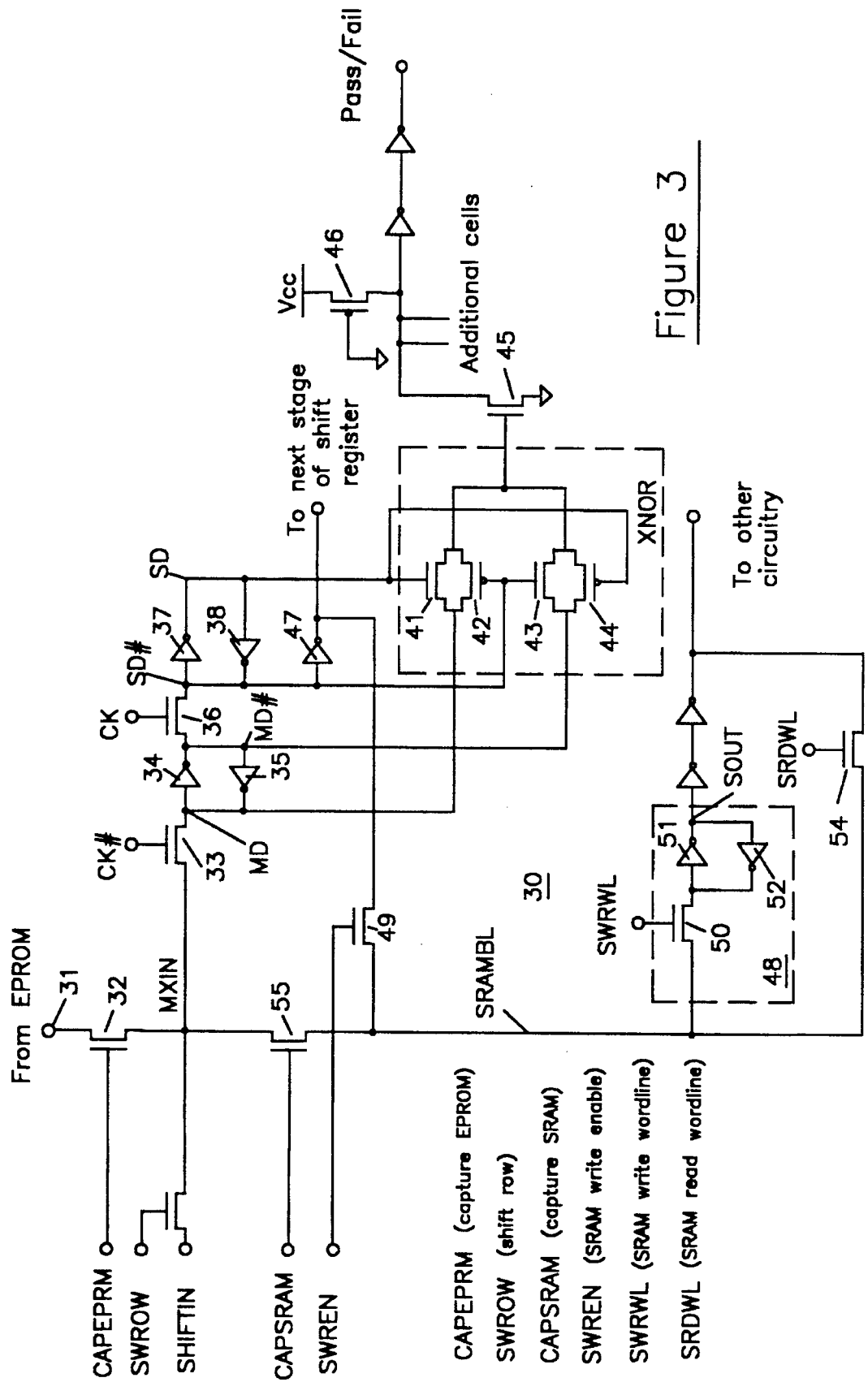
FIG. 3 is circuit diagram illustrating in detail one stage of circuitry utilized in the present invention.

Referring now to FIG. 3, there is illustrated a circuit 30 in accordance with the present invention. The circuit 30 represents one individual stage of a circuit arrangement 60 which is illustrated in block diagram form in FIG. 4. In general, the circuit arrangement 60 includes a non-volatile memory array 61 from which data is transferred, a shift register 62 which initially receives the data, a volatile memory array 63 to which the data is written from the shift register 62, and a logic circuit 64 for testing the data written to the volatile memory array 63 from the non-volatile memory array 61.

The circuit 30 receives data at a first terminal 31 when an N type FET device 32 is enabled by a capture EPROM data signal (CAPEPRM). The data received at the terminal 31 is provided, for example, from a single memory cell of a non-volatile memory array such as an EPROM memory array. This data is transferred to a node MXIN. The data at node MXIN is transferred by an N type FET device 33 in response to a clock signal CK#. The data is transferred by a first inverter 34 to a node MD#. A second inverter 35 inverts and transfers the data back to an input node MD. At this point, the data is latched into the master portion of a master/slave memory cell so that when the signal CK# is removed, the master portion remains in this state. If a one was provided at the input terminal 31, then the state of the data at node MD# is a zero. The state of the signals shown in FIG. 3 necessary to accomplish the loading of the master portion is as follows: CAPEPRM=1, CAPSRAM=0, SHROW=0, CK#=1, CK=0, SWREN=0, SWRWL=0, AND SRDWL=0.

A shift operation next occurs in the master slave cell which constitutes one stage of the shift register 62. In response to a clock signal CK, a N type FET device 36 is enabled and transfers the condition at the node MD# to a node SD#. The data at the node SD# is inverted by an inverter 37 and transferred to a node SD. An inverter 38 inverts the data and transfers it back to latch the input condition at the node SD# and hold the slave portion of the master/slave memory cell when the enabling signal CK is removed from the device 37. As will be seen below, while the slave portion is being loaded with data, the data is also being furnished to an associated SRAM bit line. The state of the signals shown in FIG. 3 used to accomplish the loading of the slave portion of the shift register in the preferred embodiment is as follows: CAPEPRM=1, CAPSRAM=0, SHROW=0, CK#=0, CK=1, SWREN=1, SWRWL=0, AND SRDWL=0.

The conditions at the nodes SD and SD# are applied to gate terminals of FET devices 41–44 which together from an XNOR logic gate. A one value at the node SD and a zero value at the node SD# enable the devices 41 and 42 to transfer the condition at the node MD to the gate of an N type FET device 45. A one value at the gate of the device 45 applies ground to an output terminal which is joined to a P type FET device 46; the devices 45 and 46 are connected to the output terminal in a wired NOR arrangement. Ground represents a zero value at an output terminal and indicates a failure to store correctly in an associated SRAM cell. Assuming a zero value input from the EPROM memory cell, a zero value at the node SD and a one value at the node SD# enable the devices 43 and 44 to transfer the condition at the node MD# to the gate of an N type FET device 45. With a zero value input, a one value appears at the node MD# and at the gate of the device 45 providing the same zero valued output. Thus, the XNOR gate tests the condition of the master and slave portions of the shift register stage and whenever the slave portion is in a condition caused by a direct shift of the condition in the master portion into the slave portion, then the device 45 applies ground at the output terminal to indicate a failure. This is the first condition which occurs as data is transferred in parallel to the stages of the shift register 62.

However, if (once the value furnished to the master portion has been shifted to the slave portion) the value held in the master portion of the shift register stage is inverted, then the device 45 is not enabled by the states transferred by the devices 41–44 of the XNOR gate and device 46 of the wired NOR arrangement applies Vcc (a one value) at the output terminal. Thus, the XNOR gate tests the condition of the master and slave portions of the memory cell and provides a zero valued output to indicate a failure when the master and slave hold states shifted from the input of the volatile memory and a one valued output to indicate a pass when the master portion is shifted to an opposite state while the slave is held in the same condition.

This XNOR logic and associated wired NOR circuitry may be utilized with the circuitry of the SRAM to provide a test of the appropriate writing of the cells. When the condition written to the master portion of the shift register stages has been shifted to the slave portion to produce a first failure, the condition at the node SD# is transferred by an inverter 47 to write an associated SRAM cell 48. Although the cell 48 is represented by an input N type FET device 50 and a pair of inverters 51 and 52, the cell may actually include the elements illustrated in more detail in FIG. 2.

A write enable signal SWREN at the gate terminal of the device 49 enables device 49 and transfers the condition at the output of the inverter 47 to the bitline of the associated SRAM cell 48. The state of the signals shown in FIG. 3 used to transfer the data to the bitline during the loading of the slave portion in the preferred embodiment is as follows: CAPEPRM=1, CAPSRAM=0, SHROW=0, CK#=0, CK=1, SWREN=1, SWRWL=0, AND SRDWL=0. A high value enabling signal SWRWL at the gate terminal of a N type FET device 50 provides access to the selected wordline and the cell 48. The signal presented is inverted by an inverter 51 and provided at an output node SOUT of the cell 48. The condition at SOUT is inverted by an inverter 52 to latch the cell 48 in the state which has been written to the cell 48 when the signal SWRWL is removed. The state of the signals shown in FIG. 3 used to accomplish the loading of the SRAM cell 48 in the preferred embodiment is as follows: CAPEPRM=1, CAPSRAM=0, SHROW=0, CK#=1, CK=0, SWREN=1, SWRWL=1, AND SRDWL=0. Thus, it will be seen that the signal initially applied to the shift register stage from the EPROM at the node MD and reflected to the node SD has been inverted at the node SOUT of the SRAM cell 48. When the SRAM write terminates, the state of the signals shown in FIG. 3 is as follows: CAPEPRM=1, CAPSRAM=0, SHROW=0, CK#=1, CK=0, SWREN=1, SWRWL=0, AND SRDWL=0.

The condition at the node SOUT is inverted twice and transferred by a N type FET device 54 (enabled by an SRDWL signal) on the SRAM read wordline to the SRAM bitline. The condition is clocked into the master portion of the shift register stage through a N type FET device 55 enabled by a signal CAPSRAM and the device 33 enabled by the signal CK#. The state of the signals to accomplish the loading of the master portion in the preferred embodiment is as follows: CAPEPRM=0, CAPSRAM=1, SHROW=0, CK#=1, CK=0, SWREN=0, SWRWL=0, AND SRDWL=1.

At this point in the operation, the enabling signal CK# is removed so that the state of the signals in the preferred embodiment is as follows: CAPEPRM=0, CAPSRAM=1, SHROW=0, CK#=0, CK=0, SWREN=0, SWRWL=0, AND SRDWL=1. When the enabling signal CK# is removed, if the SRAM was written correctly using the value received from the EPROM at the node MD, then the inverted signal at the node SOUT resides at the terminal MD and its inverse at the node MD#. If the original signal from the EPROM was a one, then the one value at the node SD and the zero at the node SD# enable the devices 41 and 42 of the XNOR gate to transfer the condition at the node MD to the gate of the device 45. With an initial EPROM input value of one, the condition at the node MD is now a zero when the SRAM has been written correctly. Consequently, the device 45 is disabled; and a pass condition is provided at the output terminal by the device 46. If the original signal from the EPROM was a zero, then the zero value at the node SD and the one value at the node SD# enable the devices 43 and 44 of the XNOR gate to transfer the condition at the node MD# to the gate of the device 45. The condition at the node MD# is a zero when the SRAM has been written correctly from an initial zero from the EPROM, so the device 45 is disabled; and a pass condition is provided at the output terminal by the device 46. Thus, with either input signal from the EPROM, the circuit of the present invention provides a pass condition to the output terminal when the SRAM cell 48 has been correctly written.

When the cell 48 has been incorrectly written, on the other hand, the condition at the node SOUT is the same as the original value furnished to the shift register at the node MD by the EPROM array. When this condition is written back to the master portion of the shift register, the master portion remains in the same condition as it was placed by the signal from the EPROM. As has been described at length above, in this condition, the master portion of the shift register provides a one value to the gate terminal of the device 45 through the XNOR gate whether the initial value was a zero or a one and generates a fail signal at the output terminal. The circuit 30 operates in the same manner as each of the succeeding SRAM cells is written.

The circuitry described above with respect to FIG. 3 offers a number of advantages in addition to simply providing a test for the accuracy of the write operation. Since each step of loading the SRAM goes through a step in which the bitline of the SRAM cell being written is initially forced to a first state into which the SRAM cell is being placed and then the opposite state is read from the SRAM cell to be placed in the master portion of the shift register, the condition on the bitline must always change in order to provide a pass condition. There is thus no chance that a residual condition on the bitline can influence the test for a correct write.

Similarly, in each step of first loading the shift register and then reloading the master portion with the data from the associated SRAM cell, the wired NOR output arrangement is forced through a fail condition before it may provide a pass condition. Thus the wired NOR is always tested for a pass condition in a worst case situation.

Another very important aspect of the invention is its lack of expense. A very large number of integrated circuit devices include circuitry called boundary test scan circuitry which conforms to an industry standard referred to as IEEE JTAG 1149.1. The circuitry provides a serial path of linked test registers through the integrated circuits. These linked test registers provide a built-in plurality of shift register stages each with built-in testing control lines and terminals. Data may be placed in a first stage of the shift register and shifted serially through the shift register to the end. On the other hand, provision is made so that data may be written in parallel into each of the shift register stages, then shifted serially in the shift register, and finally written in parallel from the stage of the shift register to integrated circuits on the chip. In order to operate this boundary scan circuitry, a plurality of control circuits and signal paths are typically built into the integrated circuits.

Figure 4:
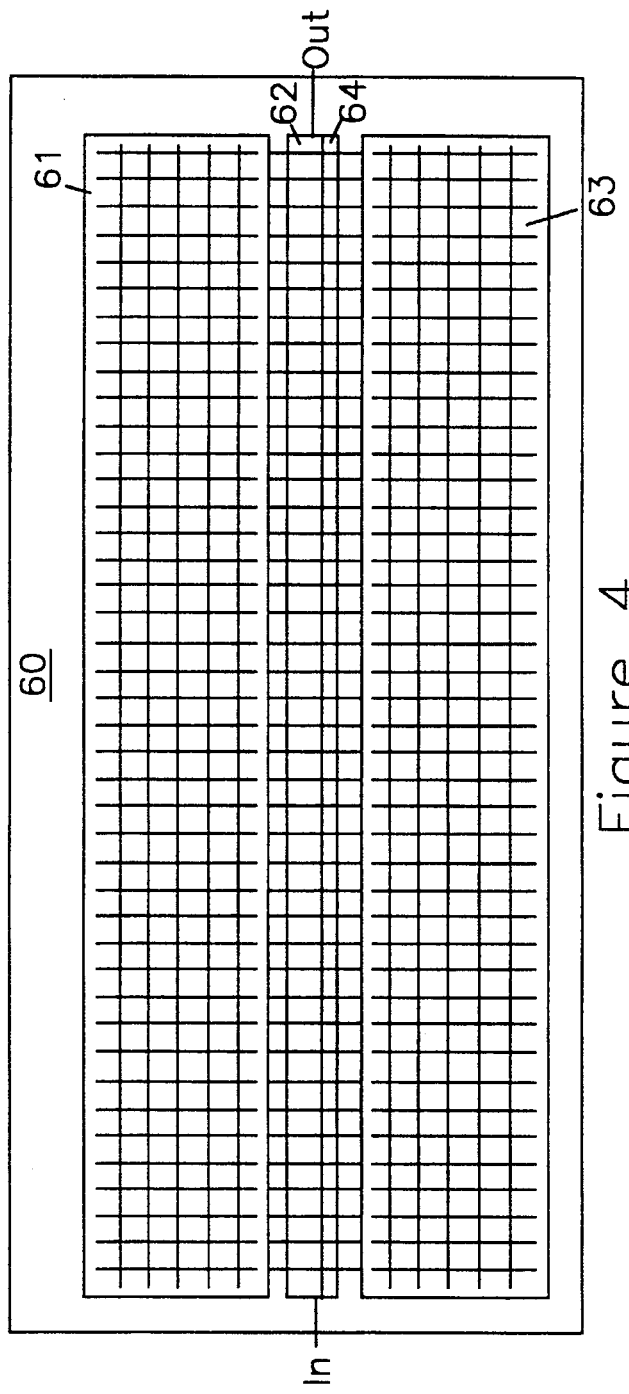
FIG. 4 is a partially-circuit/partially-block diagram of a one chip integrated circuit in accordance with the present invention including a non-volatile memory, a volatile memory, and a circuit including a shift register designed to assure that data has been correctly written to the memory cells of the volatile memory.

The present invention, in its preferred embodiment as illustrated in FIG. 4 utilizes the control signals and control circuitry provided for operating the boundary scan shift register circuitry available on the integrated circuit which includes both the EPROM memory array and the SRAM memory array. The present invention utilizes its own plurality of shift register stages for implementing its operation but utilizes the control signals and circuitry provided for operating the boundary scan circuitry. The EPROM memory array is connected through sense amplifiers to furnish the input signals in parallel to the stages of the shift register (one stage is illustrated in FIG. 3) and the SRAM memory array stages are connected in the manner illustrated to receive in parallel the data from the slave portion of each stage of the shift register and to write the inverse condition back in parallel to the master portion of each stage of the boundary scan shift register. Thus, by adding only the circuitry of the shift register, the XNOR logic arrangement, and the wired NOR output at each stage of the shift register and using the control circuitry and signals which are already available on the integrated circuit, the results of the present invention may be used to accomplished.

In the preferred embodiment illustrated in FIG. 4, the EPROM memory array 61 includes a plurality of rows of six hundred memory cells, the shift register includes six hundred master/slave stages, and the SRAM memory array 63 includes a number of rows each of six hundred memory cells. All of the cells of each six hundred cell row of the EPROM memory array 61 are written in parallel into the stages of the shift register 62. The condition in the master portion is shifted into the slave portion in all of the six hundred stages of the shift register 62. Then the condition in all six hundred stages of the shift register slave portion are shifted in parallel into the six hundred cells in one row of the SRAM memory array. Finally, the inverse condition in each of the six hundred stages of the SRAM cells is written back in parallel to the master portions of the six hundred stages of the shift register 62, and the six hundred comparisons take place in the XNOR logic circuitry. The circuitry then moves to write the next row of the EPROM memory array 61 into the next row of the SRAM memory array 64 using the shift register 62 in the manner described.

At any point where a fail is detected, the entire process may be repeated until a correctly written SRAM is obtained. If the condition cannot be corrected by rewriting, the shift register circuitry provides especially useful information to detecting what has failed. For example, the data in the stages of the shift register 62 in a failed arrangement may be shifted out serially under laboratory conditions and recorded so that the particular cells which failed may be detected. This allows very specific testing of failed circuitry in a manner which is unusual for SRAM memory arrays.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. In a system having a source memory device, a destination memory device, and a logic device coupled to said source and destination memory devices, said logic device including a shift register with a master portion and a slave portion, a method for verifying the accuracy of a data transfer operation from said source memory device to said destination memory device comprising the steps of:

writing data from said source memory device to said master portion;

shifting data from said master portion to said slave portion;

writing said data from said slave portion to said destination memory device;

writing said data from said destination memory device to said master portion of said shift register in said logic device; and comparing data in said master portion with data in said slave portion to verify the accuracy of the data transferred from said source memory device to said destination memory device.

2. The method of claim 1 wherein said source memory device comprises a non-volatile memory device and said destination memory device comprises a volatile memory device.

3. In a system having a source memory, a destination memory, and a shift register coupled to said source and destination memories, said shift register including a master portion and a slave portion, a method for verifying the accuracy of a data transfer operation from said source memory to said destination memory comprising the steps of:

writing source data from said source memory to said master portion of said shift register;

shifting said source data from said master portion of said shift register to said slave portion of said shift register;

writing said source data from said slave portion of said shift register to said destination memory;

writing destination data from said destination memory to said master portion of said shift register; and comparing said destination data in said master portion of said shift register and said source data in said slave portion of said shift register to verify the accuracy of the data transfer operation from said source memory to said destination memory.

4. The method of claim 3 wherein said step of writing destination data from said destination memory includes inverting said destination data when written into said master portion of said shift register.

5. The method of claim 3 wherein said source memory device is a non-volatile memory device and said destination memory device is a volatile memory device.

6. The method of claim 3 wherein said step of comparing said destination data includes performing an exclusive-NOR function on the data in said master and slave portions of said shift register.

7. An apparatus for verifying the accuracy of a data transfer operation from a source memory to a destination memory, said apparatus comprising:

a shift register coupled to said source memory and said destination memory, said shift register having a master portion and a slave portion;

a first circuit coupled to transfer source data from said source memory to said master portion of said shift register;

a second circuit coupled to shift said source data from said master portion of said shift register to said slave portion of said shift register;

a third circuit coupled to transfer said source data from said slave portion of said shift register to said destination memory;

a fourth circuit coupled to transfer destination data from said destination memory to said master portion of said shift register; and a fifth circuit coupled to compare said destination data in said master portion of said shift register and said source data in said slave portion of said shift register to verify the accuracy of the data transfer operation from said source memory to said destination memory.

8. The apparatus of claim 7 wherein said fourth circuit also inverts said destination data.

9. The apparatus of claim 7 wherein said fifth circuit includes a logic circuit that verifies transfer of said source data from said source memory to said destination memory.

10. The apparatus of claim 7 wherein said fifth circuit includes an exclusive-NOR logic circuit and a wired-NOR circuit.

11. The apparatus of claim 7 wherein said source memory comprises a non-volatile memory device and said destination memory is a volatile memory device.

12. The apparatus of claim 7 wherein said source memory comprises an electrically-programmable read-only memory device and said destination memory is a static random-access memory device.

13. The apparatus of claim 7 wherein said apparatus comprises an integrated circuit including said source memory and said destination memory.

14. A computer system comprising:

a system bus;

a central processing unit coupled to said system bus;

a first memory device including a plurality of memory cells and coupled to said system bus;

a second memory device including a plurality of memory cells and coupled to said system bus;

a shift register coupled to said first memory device and said second memory device, said shift register having a master portion and a slave portion;

a first circuit coupled to transfer source data from said first memory device to said master portion of said shift register;

a second circuit coupled to shift said source data from said master portion of said shift register to said slave portion of said shift register;

a third circuit coupled to transfer said source data from said slave portion of said shift register to said second memory device;

a fourth circuit coupled to transfer destination data from said second memory device to said master portion of said shift register; and a fifth circuit coupled to compare said destination data in said master portion of said shift register and said source data in said slave portion of said shift register.

15. The apparatus of claim 14 wherein said fourth circuit also inverts said destination data.

16. The apparatus of claim 14 wherein said fifth circuit includes a logic circuit that verifies transfer of said source data from said source memory to said destination memory.

17. The apparatus of claim 14 wherein said first memory device comprises a non-volatile memory device and said second memory device comprises a volatile memory device.

18. The apparatus of claim 14 wherein said first memory device comprises an electrically-programmable read-only memory device and said second memory device comprises a static random-access memory device.

* * * * *